(12) United States Patent
Elshaer et al.

(10) Patent No.: US 11,108,371 B2
(45) Date of Patent: Aug. 31, 2021

(54) TUNABLE SWITCHED IMPEDANCE MATCHING NETWORK

(71) Applicants: Ford Global Technologies, LLC, Dearborn, MI (US); The Ohio State Innovation Foundation, Columbus, OH (US)

(72) Inventors: Mohamed Elshaer, Canton, MI (US); Richard William Kautz, Rochester, MI (US); Chingchi Chen, Ann Arbor, MI (US); Jin Wang, Powell, OH (US); John Paul Gibeau, Canton, MI (US)

(73) Assignees: Ford Global Technologies, LLC, Dearborn, MI (US); The Ohio State Innovation Foundation, Columbus, OH (US)

( * ) Notice: Subject to any disclaimer, the term of this patent is extended or adjusted under 35 U.S.C. 154(b) by 100 days.

(21) Appl. No.: 16/687,402

(22) Filed: Nov. 18, 2019

(65) Prior Publication Data
US 2021/0152145 A1    May 20, 2021

(51) Int. Cl.
*H03H 7/38* (2006.01)
*B60L 53/22* (2019.01)
*B60L 50/64* (2019.01)
*H02M 7/217* (2006.01)

(52) U.S. Cl.
CPC ............ *H03H 7/38* (2013.01); *B60L 50/64* (2019.02); *B60L 53/22* (2019.02); *H02M 7/217* (2013.01)

(58) Field of Classification Search
CPC .......... H03H 7/38; B60L 53/22; B60L 50/64; H02M 7/217
See application file for complete search history.

(56) References Cited

U.S. PATENT DOCUMENTS

| | | | |
|---|---|---|---|
| 9,384,885 B2 * | 7/2016 | Karalis | H02J 50/50 |
| 2012/0112702 A1 * | 5/2012 | Steigerwald | H02J 7/0072 320/137 |
| 2017/0033586 A1 | 2/2017 | Weidner et al. | |
| 2017/0117751 A1 | 4/2017 | Karnstedt et al. | |
| 2017/0214335 A1 * | 7/2017 | Basic | H02M 7/48 |

FOREIGN PATENT DOCUMENTS

CN    107154788 A    9/2017

* cited by examiner

*Primary Examiner* — Jared Fureman
*Assistant Examiner* — Duc M Pham
(74) *Attorney, Agent, or Firm* — David B. Kelley; Brooks Kushman P.C.

(57) ABSTRACT

A power system includes a traction battery, and a rectifier including a pair of diodes, a pair of switches, and a pair of capacitors each in parallel with a different one of the switches such that alternating current input to the rectifier results in alternating voltage having parabolic approaches to maximum magnitude values being input to the rectifier. The maximum magnitude values correspond to a magnitude of voltage output to the traction battery.

18 Claims, 6 Drawing Sheets

TUNABLE SWITCHED IMPEDANCE MATCHING NETWORK

TECHNICAL FIELD

This disclosure relates to impedance matching networks.

BACKGROUND

Electrified vehicles, including hybrid, plug-in hybrid, and electric vehicles, are designed to be propelled or partially propelled by one or several electric machines, such as AC induction machines, DC brushless electric machines, and permanent magnetic synchronous machines. A battery pack is included in the electrified vehicles to provide electricity to the electric machines. Hybrid and plug-in hybrid vehicles may also have built-in internal combustion engines, which are able to charge the battery pack and/or propel the electrified vehicle. The battery pack includes multiple battery cells in series and/or in parallel to achieve high voltage and/or high output power to meet the requirements of the electric machines. The battery pack also provides power to other equipment and circuits, such as the DC-DC converter, on-board generator, and air conditioning system.

SUMMARY

A power system includes a traction battery, and a rectifier including a pair of diodes, a pair of switches, and a pair of capacitors each in parallel with a different one of the switches such that alternating current input to the rectifier results in alternating voltage having parabolic approaches to maximum magnitude values being input to the rectifier. The maximum magnitude values correspond to a magnitude of voltage output to the traction battery.

Vehicle power system circuitry includes a rectifier including a pair of diodes, a pair of switches, and a pair of capacitors each in parallel with a different one of the switches such that alternating current input to the rectifier and complementary operation of the switches results in alternating voltage having zero-dwell periods immediately followed by parabolic approaches to maximum magnitude values being input to the rectifier.

A vehicle power inverter includes a rectifier including a pair of diodes, a pair of switches, a pair of capacitors each in parallel with a different one of the switches, and another capacitor in parallel with the pair of capacitors. The pair of switches are electrically between the pair of diodes and the pair of capacitors. The pair of capacitors are electrically between the pair of switches and the another capacitor.

DETAILED DESCRIPTION

Figure 1:
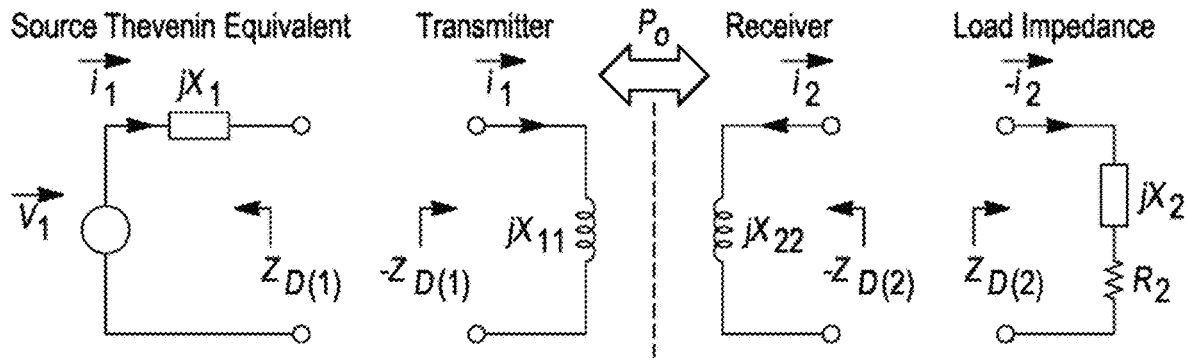
FIG. 1 is a schematic diagram of coupler equivalent circuitry showing the driving point impedance.

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

In a wireless power transfer (WPT) system, alignment between the vehicle-coil and ground-coil is not always guaranteed. Hence, the system should be designed to tolerate a range of misalignment positions between the two coils. Alignment variations may cause frequency splitting, also known as bifurcation phenomena, which becomes noticeable as the coupling rate increases. This is expected because when two resonators are brought close to each other, their individual fields will start to interact with the resonators themselves. This interaction alters the self-inductance of each coil causing each resonator or coupler to have a different resonant frequency.

Coupled Mode Theory (CMT) can be utilized to model any arbitrary number of coupled resonators considering energy conservation. Some have investigated the feasibility of efficiently transferring power over a considerable distance by using slow evanescent field patterns. Furthermore, CMT was utilized to calculate the power transfer efficiency. The center frequency, or the frequency at which both resonators are tuned to, is perturbed if the resonant frequencies of the individual couplers are not equal. Others have derived the coupled mode frequency split and illustrated that perturbation in the center frequency increases with stronger coupling. Frequency splitting was also studied, and general criteria were derived to guide the controller design and identify power transfer capability. Moreover, mode splitting has been used for passive device sensing.

Certain efficiency expressions assume that the system achieves perfect magnetic resonance; thus, it does not consider frequency splitting caused by reactance mismatch. Additionally, the figure of merit (FOM) defined in earlier works relates the coupling rate (K) to the coils' intrinsic loss rates ($\Gamma1$, $\Gamma2$). Strong magnetic resonance is realized if the rate at which energy is being transferred to the load is much faster than the rate at which energy is drained by losses in the system. Hence, strong coupling is realized when FOM is very high (FOM>>1). Furthermore, the FOM expression is used as an indicator of the coupler quality; the higher the FOM, the better the design. However, this expression does not reflect the capability of the impedance matching network and control method since it assumes perfect impedance matching.

Here, constraints for the coupler's driving point impedance are derived to guide the design of the impedance matching network (IMN) and achieve highest coupler efficiency. A method for transforming the coupler's driving point impedance is introduced. Additionally, a new parameter, reactance mismatch coefficient, is defined to quantify the impact of impedance mismatch on efficiency. A method for optimizing the couplers' energies is presented and then used to guide the IMN design. Furthermore, the known FOM expression is modified to account for the reactance mismatch between the coupler and IMN. Couplers' initial efficiency is calculated in terms of the coils' quality factors. Then the sensitivity to magnetic coupling and reactance mismatch is studied. Moreover, circuit simulation is presented for an exemplary WPT system, as a case study, to show the decrease in efficiency when operating at non-optimal coupler energy.

Impedance Matching Network

A. Impedance Matching Requirements

Average energy flow density from the transmit coil to receive coil, in one cycle, depends on the electric and magnetic fields generated by both coils. The amount of power transferred (1) over the air gap is calculated by taking the surface integral of the Poynting vector over the center plane between the two coils. Energy stored in the magnetic field generated by one coil is related to circuit parameters by $W_{m1}=\frac{1}{2}LI^2=\frac{1}{4}\int\mu|H|^2dv$. Furthermore, the apparent power at the transmitter coil's port is calculated by (2). For a lossless coupler, the active power is determined by (1) and is equal to the real part of (2). Additionally, the imaginary part of (2) or the reactive power is related to the stored energy in the magnetic field, generated by the coil, and stored energy in the electric field, inside the matching capacitor, $P_Q=2\omega[W_m-W_e]$.

$$P_G\int_{-\infty}^{\infty}[\text{Re}(\vec{E}_1(x,y)\times\underline{H}^*_2(x,y))+\text{Re}(\vec{E}_2(x,y)\times\vec{H}^*_1(x,y))]dxdy \quad (1)$$

$$S_1=\frac{1}{2}[-X_{12}I_1I_2\sin(\theta_2-\theta_1)+j(X_{11}I_1^2+X_{12}I_1I_2\cos(\theta_2-\theta_1))] \quad (2)$$

What is important to note in (2) is that to transfer a given amount of power, a minimum stored energy in the magnetic fields, produced by each coil, is needed, evident from the $\frac{1}{2}X_{11}I_1^2$ term. Maximum power transfer between two coils is achieved if the current flowing through the transmit coil leads/lags current flowing through the receive coil by 90° (which is the condition to maximize the sine function in the real part of (2)). To achieve this condition through impedance matching, in resonant WPT systems, a capacitive energy storage element is added such that the reactive power in the coil is minimized for a given amount of power transfer. A relationship between energy, power, magnetic coupling and reactance mismatch is needed to guide the impedance matching network design.

B. Driving Point Impedance Transformation

The driving point impedance for a lossless coupler is defined by the voltage and current at its port. FIG. 1 shows an equivalent circuit for a lossless WPT system. The transmitter coil is connected to a source Thevenin equivalent circuit, and the receiver coil is connected to a load impedance. The coupler's driving point impedance is defined by (3). The subscript "n" represents the coupler number.

The voltage across the source coupler can either be expressed in terms of the driving point impedance (4) or in terms of the coupler's self and mutual reactances (5). By equating (4) to (5) and writing the phasor current in terms of its magnitude and phase, (6) is obtained. The expression on the left side of (6) can be further simplified by introducing a new definition called as the coupler self-mismatch vector defined in (7). Furthermore, the reactance mismatch angle δ is defined by (8). Thus, the transmitter coupler self-mismatch vector (transformed impedance) is expressed by (9). A similar analysis is done to define the self-mismatch vector for the receiver coil (10).

$$Z_{D(n)} = R_{D(n)} + jX_{D(n)} \quad (3)$$

$$\vec{v_1} = -Z_{D1}\vec{\iota_1} = -(R_{D1}+jX_{D1})\vec{\iota_1} \quad (4)$$

$$\vec{v_1} = jX_{11}\vec{\iota_1} + jX_{12}\vec{\iota_2} \quad (5)$$

$$[R_{D1}+j(X_{11}+X_{D1})]I_1e^{j\theta_1} = -jX_{12}I_2e^{j\theta_2} \quad (6)$$

$$\vec{\gamma_n} = R_{D(n)} + j\Delta X_n \text{ where } \Delta X_n = \text{Im}\{Z_{D(n)}\} + X_{nn} \quad (7)$$

$$\delta = \theta_1 - \theta_2 - \frac{\pi}{2} \quad (8)$$

$$\vec{\gamma_1} = \frac{X_{12}I_2}{I_1}e^{j(\theta_2-\theta_1-\frac{\pi}{2})} = \gamma_1 e^{-j(\delta+\pi)} = -\gamma_1 e^{-j\delta} \quad (9)$$

$$\vec{\gamma_2} = \frac{X_{12}I_1}{I_2}e^{j(\theta_1-\theta_2-\frac{\pi}{2})} = \gamma_2 e^{j\delta} \quad (10)$$

Figure 2:
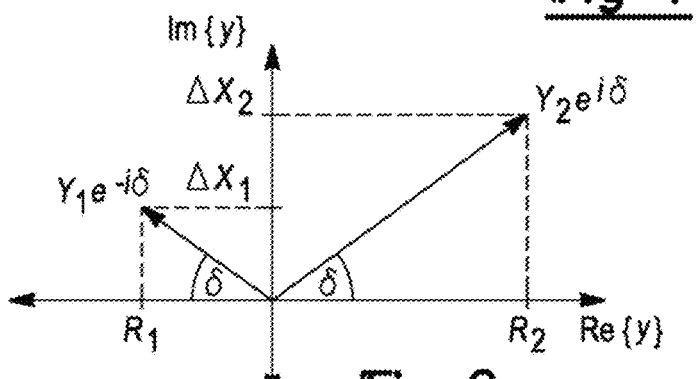
FIG. 2 is a chart showing self-mismatch vectors for both the transmitter and receiver coils.

The impedance mismatch chart is used to plot the receiver and transmitter coils' self-mismatch vectors as shown in FIG. 2; the real-axis corresponds to the driving point impedance real component, and the imaginary-axis corresponds to the sum of the imaginary component of the driving point impedance and coil's self-reactance. By using these transformed vectors, trigonometry and vector analysis are used to calculate salient circuit parameters such as power and efficiency.

The impedance loading the receiver coil depends on the secondary side IMN design and load ($Z_{D2}=R_2+jX_2$). By using (7), the receiver coil self-mismatch vector can be written by transforming $Z_{D2}$ (11). Hence the magnitude and angle of the receiver coil self-mismatch vector are calculated by (12) and (13), respectively.

$$\gamma_2 = R_2 + j(X_2+X_{22}) = \gamma_2 e^{j\delta} \quad (11)$$

$$\gamma_2 = \sqrt{R_2^2+\Delta X_2^2} \quad (12)$$

$$\delta = \tan^{-1}(\Delta X_2/R_2) \quad (13)$$

The magnitude of the receiver coil self-mismatch vector is represented in two different forms as shown by (10) and (12). Hence, by equating these two magnitudes, the current ratio between the transmitter coil current and receiver coil current is calculated (14). Also, it was shown earlier that the self-mismatch vectors (9-10) are related to each other by the mismatch angle δ. Hence, substituting (14) into (10) leads to an expression for the source coil self-mismatch vector (15). It is important to note that both (11) and (15) are sufficient expressions for calculating coupler efficiency and power transfer over the air gap. This means that the reactance mismatch ($\Delta X$) is a key parameter for characterizing the WPT coupler performance.

$$I_2/I_1 = X_{12}/\gamma_2 = X_{12}/\sqrt{R_2^2 + \Delta X_2^2} \tag{14}$$

$$\vec{\gamma_1} = -\gamma_1 e^{-j\delta} = -\frac{X_{12}^2}{\sqrt{R_2^2 + \Delta X_2^2}} e^{j\tan^{-1}\left(\frac{\Delta X_2}{R_2}\right)} \tag{15}$$

Optimization of Coupler Efficiency and Power Transfer Capability

Circuit theory is sufficient to describe the WPT system under quasi-static approximation, which is valid when the separation distance between the coils is greater than the wires' cross section width and less than the fields' wavelength. Furthermore, coupled mode expressions could be directly converted to circuit parameters. The coupler self-mismatch vector is directly used to determine the real components of the driving point impedances (R1 & R2) while accounting for the reactance mismatch between the matching network and coil. By the help of FIG. 2 and using trigonometry, R1 and R2 are calculated by (16). Furthermore, by substituting (16) into (17) and decomposing X12 (i.e. $X_{12}=k\omega\sqrt{L_1 L_2}$), the power transferred over the air gap, for a lossless coupler, is calculated by (18). Where Wm1 and Wm2 are the energy stored in the magnetic fields generated by the transmitter and receiver coils, respectively (i.e. $W_m = \frac{1}{2} L I^2$).

$$R_1 = -\frac{X_{12} I_2}{I_1} \cos\delta \; \& \; R_2 = \frac{X_{12} I_1}{I_2} \cos\delta \tag{16}$$

$$P_G = \frac{1}{2} |R_1| I_1^2 = \frac{1}{2} |R_2| I_2^2 \tag{17}$$

$$P_G^2 = \frac{I_1^2 I_2^2 X_{12}^2}{4} \cos^2\delta \Rightarrow P_G = \omega k \sqrt{W_{m1} W_{m2}} \cos\delta \tag{18}$$

So far, the system equation for power transfer over the airgap is derived for a lossless system. In a non-ideal system, coupler efficiency is reduced due to the following loss mechanisms:
1. Copper losses including eddy current and proximity losses in windings and any conductive medium.
2. Eddy current and hysteresis losses occurring in the ferromagnetic material.
3. Dielectric losses occurring in all electric fields.

$$Q = 2\pi \frac{\text{Peak Energy Stored in the Fields}}{\text{Energy Disipated per Cycle}} \tag{19}$$

$$P_{L1} = \omega W_{m1}/Q_1 \; \& P_{L2} = \omega W_{m2}/Q_2 \tag{20}$$

$$\eta = 1/(1+T) \text{ where } T = (P_{L1} + P_{L2})/P_G \tag{21}$$

$$\eta = \frac{1}{1+T} \text{ Where } T = \frac{1}{k\cos\delta}\left(\frac{1}{Q_1}\sqrt{\frac{W_{m1}}{W_{m2}}} + \frac{1}{Q_2}\sqrt{\frac{W_{m2}}{W_{m1}}}\right) \tag{22}$$

The reactance mismatch coefficient (23) is introduced to show the impact of impedance matching on the power transfer and coupler efficiency. In order to achieve the highest efficiency, the normalized loss function (T) needs to be minimized by optimizing the magnetic energies such that $T(W_{m1}, W_{m2}) \ll 1$). Henceforth, an analytical optimization is performed by using the Lagrangian method.

Reactance mismatch coefficient:

$$\frac{1}{\sqrt{1+(\Delta X_2/R_2)^2}} \tag{23}$$

In order to find an explicit analytical solution to the Lagrangian equation, the coupler energy ratio $N_E = \sqrt{W_{m1}/W_{m2}}$ is defined. Thus, the normalized loss function and power equation are redefined by (24) and (25), respectively, which are both functions of $N_E$ and $W_{m2}$. Highest efficiency occurs when T is minimized while being constrained by (25) or when $N_E$ and $W_{m2}$ are chosen to satisfy (26). Hence, the optimal receiver coil energy and normalized energy ratio are calculated by (27) and (28), respectively. Furthermore, the Lagrangian multiplier (29) is found to be zero which indicates that the optimal solution obtained by (27) and (28) is optimum for all power levels. Therefore, the absolute maximum coupler efficiency can be determined in terms of the couplers' quality factors, coupling coefficient and reactance mismatch coefficient (30).

$$T(N_E, W_{m2}) = \frac{1}{k\cos\delta}\left(\frac{N_E}{Q_1} + \frac{1}{Q_2 N_E}\right) \tag{24}$$

$$P_G(N_E, W_{m2}) = \omega k N_E W_{m2} \cos\delta \tag{25}$$

$$\Delta T(N_E, W_{m2}) = \lambda \Delta P_G(N_E, W_{m2}) \tag{26}$$

$$W_{m2(opt)} = \frac{1}{2} L_2 I_2^2 = \frac{P_G}{k\omega\cos\delta}\sqrt{\frac{Q_2}{Q_1}} \tag{27}$$

$$N_{E(opt)} = \sqrt{Q_1/Q_2} \tag{28}$$

$$\lambda = dT/dP_G = 0 \tag{29}$$

$$\eta_{opt} = \frac{1}{1+T_{opt}} = \frac{2}{k\cos\delta\sqrt{Q_1 Q_2}} \tag{30}$$

Simulation Results and Discussion

A. Couplers' Efficiency Sensitivity to Coupling Coefficient and Reactance Mismatch To quantify how the coupling and reactance mismatch coefficients impact efficiency, the efficiency expression defined in (30) is divided into two terms: initial efficiency ($\eta_o$) and coefficients efficiency ($\eta_{k\delta}$), which are defined in (31). The product of both these efficiencies is the total coupler efficiency (i.e. $\eta_{opt} = \eta_o \eta_{k\delta}$). The initial efficiency, corresponds to the case when all fields produced by the transmitter coil are coupled to the receiver coil, indicating perfect magnetic coupling (k=1) and when the receiver coil reactance is perfectly matched by its IMN (cos $\delta$=1). Furthermore, the coefficients efficiency corresponds to the case when not all fields produced by the transmitter coil are coupled to the receiver coil (k<1) and when the reactance of the receiver coil and its IMN are mistuned (0<$\delta$<$\pi$/2). The initial efficiency is plotted in FIG. 3 (a) as a function of Q1 and Q2. Moreover, FIG. 3(b) shows the impact of both the coupling and reactance mismatch coefficients on efficiency. This efficiency is achieved if and only if the energy per unit watt or inductance per unit ohm satisfy (32) for the transmitter and receiver coils, respectively. FIG. 4 shows the required ratio of energy stored in the magnetic field to wireless power transfer for the receiver coils. This ratio is used to guide the IMN design to achieve the efficiency calculated in FIG. 3.

In the previous analysis, the impedance transformation is used to calculate power transferred over the air gap in terms of coils' magnetic energies for a lossless system. This analysis can be extended to the case of lossy couplers by incorporating coupler quality factors as defined by (20) following equation (19). If we assume input power is increased to account for the losses described before, the coupler efficiency can be calculated by (21), where T is defined as the normalized loss function. It should be noted that the power dissipated in the receiver coil driving point impedance obtained for the lossless case (PG in equation (18)) still represents the power delivered to the load in the lossy case. Additionally, the perturbation in the transmitter coupler energy, which is due to the receiver coil loss, is neglected. Hence, by substituting (18) and (20) into (21), coupler efficiency is derived (22).

$$\eta_o = \frac{\sqrt{Q_1 Q_2}}{2 + \sqrt{Q_1 Q_2}} \& \eta_{k\theta} = \frac{1 + T_o}{1 + \frac{T_o}{k\cos\delta}} \text{ where } T_o = \frac{2}{\sqrt{Q_1 Q_2}} \quad (31)$$

$$\frac{W_{m1(opt)}}{P_G} = \frac{L_p}{R_1} = \frac{N_E}{k\omega} \& \frac{W_{m2(opt)}}{P_G} = \frac{L_s}{R_2} = \frac{1}{k\omega N_E} \quad (32)$$

Both the coupling and reactance mismatch coefficients are factors with a range between zero and one thus their product is a number always less than one. Additionally, from (30), it can be realized that the reactance mismatch coefficient has a similar impact as the coupling coefficient on efficiency. Therefore, the figure-of-merit expression modified to account for reactance mismatch, as shown in (33). Note that when converting the FOM to circuit parameters, it is expressed by FOM=$k\sqrt{Q_1 Q_2}$.

$$\text{FOM} = k \cos \delta \sqrt{Q_1 Q_2} \quad (33)$$

B. Optimal Coupler Driving Point Impedance

The impedance loading the secondary coupler impacts its efficiency. Constraints for both its real and imaginary components are needed to achieve the absolute maximum efficiency obtained by (30) and shown in FIG. 3. Any deviation from this optimal impedance will result in operation at lower efficiency. Perfect magnetic resonance is achieved when the reactive power in the receiver coupler is minimized (i.e. $\delta$=0). Hence, the reactance mismatch must be zero ($\Delta X_2$=0). Additionally, the energy stored in the secondary coupler must satisfy (27). Accordingly, the optimal secondary coupler driving point impedance is calculated by (34).

$$Z_{D2(opt)} = kX_{22}\sqrt{Q_1 Q_2} - jX_{22} \quad (34)$$

Couplers' electrical parameters are characterized by using the impedance analyzer at several misalignment positions. The measured self-inductances of both the transmitter and receiver couplers are shown, in FIG. 5, as a function of the coupling coefficient. A single series capacitor is used to match the reactance of the receiver coupler. Additionally, the switching frequency range is constrained to be within the range defined by the SAE J2954 standard (81.35 kHz-90 kHz). In order to match the coupler reactance, while accounting for $L_2$ variations and satisfy the frequency range constraint, the capacitor value is selected to be 42 nF. Hence, the reactance defined in (33) for the measured range of $L_2$ is achieved by adjusting the frequency.

Figure 6:
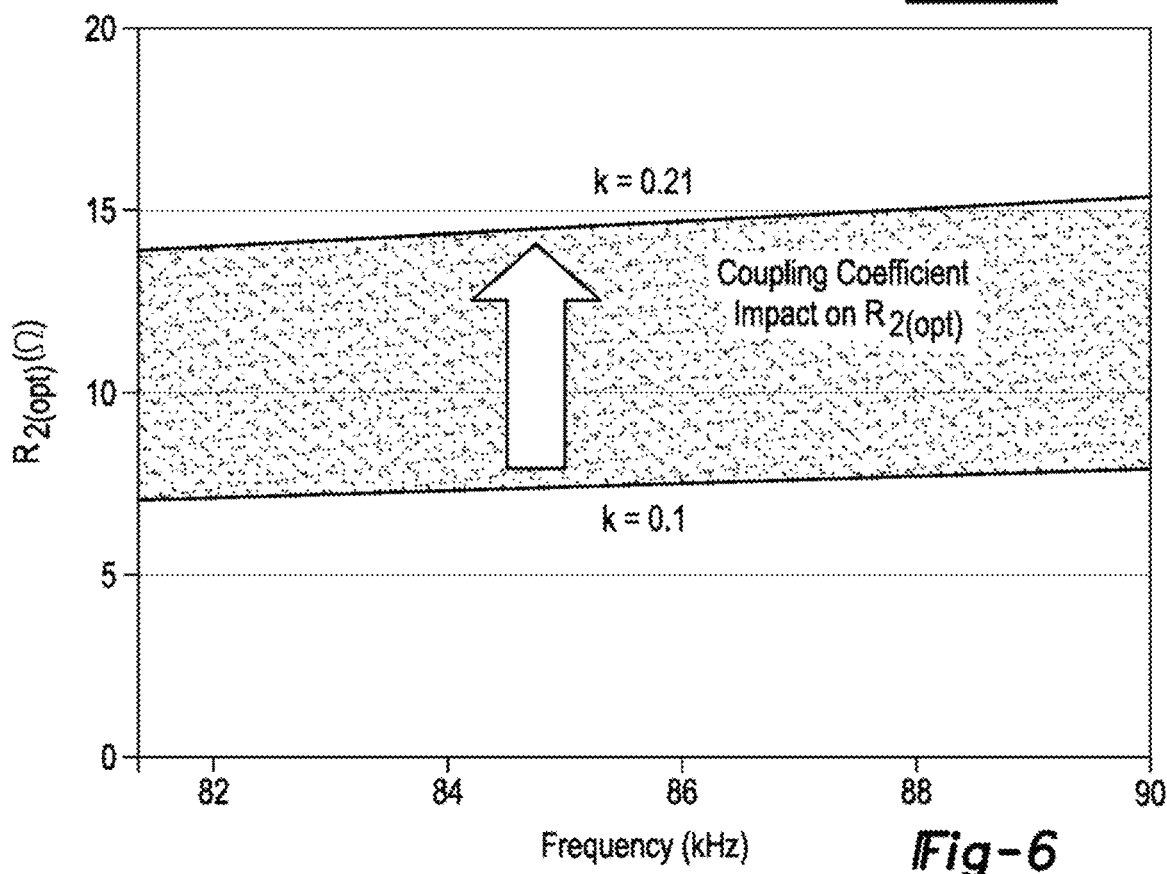
FIG. 6 is a plot of secondary coupler driving point impedance's real-component as a function of the coupling coefficient ($Q_1=300$ and $Q_2=135$).

The value for R2 can now be defined in terms of the secondary matching capacitor (35). FIG. 6 shows how the optimal value for R2 changes in relation to the coupling coefficient. If a full-bridge rectifier is connected directly after the capacitor and by using the fundamental approximation, the rectifier input port can be approximated by an effective resistor ($R_e = 8/\pi^2 R_L$). In this case, $R_e$ has to track the optimal value of R2 which has a range of 7Ω to 15.42Ω for an output power of 3.3 kW. This means that the output voltage must vary form 168.8V to 250.4V. By allowing the WPT output voltage to vary and controlling the frequency to match the receiver coil reactance, the absolute maximum coupler efficiency is achieved. However, such operation requires a second power converter to regulate the voltage and power to the load.

$$R_2 = \text{Re}\{Z_{D2(opt)}\} = \frac{k}{\omega C_s}\sqrt{Q_1 Q_2} \quad (35)$$

Optimal efficiency for the transmitter supply circuitry may not be achieved even if the coupler is operated at its optimal driving point impedance, which is defined by (34). From FIG. 5, it can be realized that not only the secondary coupler's self-inductance varies with coupling, but also the transmitter coupler exhibits variations. If a single series capacitor is used to tune the transmitter coupler, then the coupler self-reactance and capacitor reactance are not guaranteed to be matched as the coupling varies in accordance with the alignment position. For this matching network topology, the frequency is the only parameter that can be used to drive the reactance mismatch coefficient to one (cos $\delta$=1). Since the frequency is adjusted according to the receiver coupler, reactance mismatch between the transmitter coupler and its matching capacitor has to be compensated by the inverter. Thus, the inverter may not always operate at unity power factor. Although, in some cases, the inverter may operate at power factor less than one, the primary series matching capacitor does not incur any extra stress. That is because the current flowing through it is dictated by the load impedance. In this case, both the coupler and primary IMN are operated at their maximum efficiencies. However, the inverter efficiency and design may need special consideration.

FIG. 2 is used to calculate the transmitter coupler self-mismatch vector, from which the driving point impedance is calculated, $Z_{D1} = R_1 + j(\Delta X_1 - X_{11})$. Furthermore, R2 and $\Delta X_2$ can be expressed in terms of the receiver coupler parameters. By leveraging the relationship obtained from taking the product of the magnitudes acquired from both the transmitter and receiver couplers self-mismatch vectors ($\gamma_1 \gamma_2 = X_{12}^2$), the produce of their real and imaginary components are obtained by (36). Thus, by using (3-4) and (36), the transmitter coupler driving point impedance is calculated and expressed in terms of the reactance mismatch coefficient (37). Note that power dissipated in Re{$Z_{D1}$} corresponds to the power delivered to the transmitter coupler and is proportional to the square of the reactance mismatch coefficient. This means that if the secondary coupler exhibits any reactance mismatch, the primary coupler current will increase thus higher conduction losses are incurred in both Cp and the inverter switches. This supports the idea of regulating the frequency to drive $\delta$ to zero under all alignment positions.

$$R_1 R_2 = -X_{12}^2 \cos^2\delta \ \&\Delta X_1 \Delta X_2 = X_{12}^2 \sin^2\delta \quad (36)$$

$$Z_{D1} = -\frac{X_{12}\cos^2\delta}{R_2} + j\left(\frac{X_{12}\sin^2\delta}{\Delta X_2} - X_{11}\right) \quad (37)$$

Figure 7:
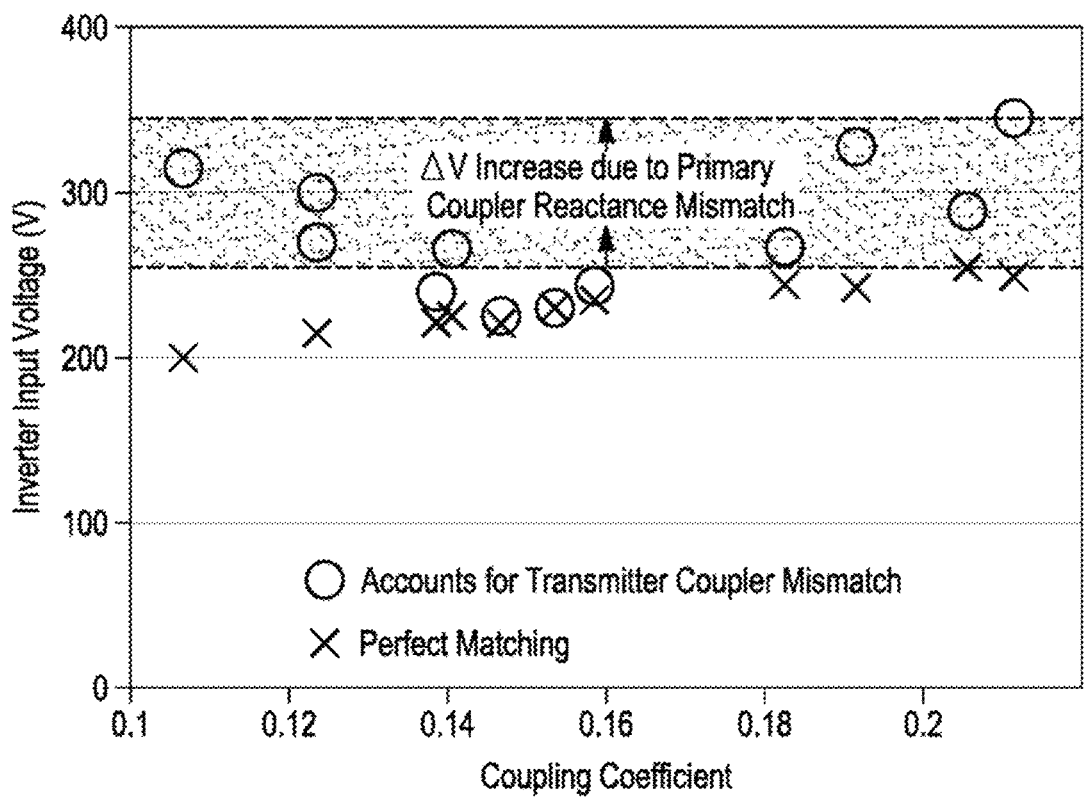
FIG. 7 is a plot of absolute minimum DC-link voltage.

In this study, a full-bridge inverter is used to supply AC voltage to the transmitter's IMN and coupler. The optimal transmitter driving point impedance is calculated by substituting R2, in (37), with its optimal value given in (35). Furthermore, the impedance loading the inverter is calculated by (38), which assumes that the output voltage is controlled such that R2 tracks (35). By using the fundamental approximation, the optimal value for the inverter's input voltage is calculated, as a function of magnetic coupling (39). The absolute minimum DC-link voltage (Vin) required for a given amount of wireless power transfer occurs when the inverter is operated at unity output power factor and when the reactance mismatch coefficient is one. FIG. 7 shows the absolute minimum DC-link voltage in blue which assumes perfect reactance matching between the transmitter coupler and the compensating capacitor, which occurs when $$X_{11} - \frac{1}{\omega C_p} = 0$$

in (38). However, that cannot be guaranteed for the whole range of $L_1$. Hence, operation at higher DC-link voltage may be needed to compensate for the reactance mismatch thus requiring MOSFETs with higher voltage ratings. For this design, Cp is selected such that the input voltage is minimized for the case of largest transmitter coupler reactance mismatch (Cp=16.6 nF). The impact of transmitter coupler reactance mismatch on DC-link voltage is shown in FIG. 7 (in red).

While under the perfect matching condition, the input voltage has a range between 200 V to 254 V, accounting for transmitter coupler reactance mismatch will result in a range between 237 V to 347 V. This indicates that the voltage rating of the inverter switching devices must increase by 93 V to handle supplying the reactive power. Additionally, the DC-link capacitor size has to increase in order to supply the reactive power. Typically, the DC-link capacitor is required to store 5 J of energy per 1 kVA. Table summarizes the simulation results for a 3.3 kW WPT system. R2 is varied by ±40% from its optimal value. These results validate the accuracy of the derived equations. As can be predicted by the absolute maximum efficiency equation, operation at anon-optimal $R_2$ increases the coupler losses by $\Delta P_{Loss}$ as quantified in table 1.

$$Z_{inv} = \frac{X_{12}^2 \omega C_s \cos^2\delta}{k}\sqrt{\frac{Q_2}{Q_1}} + j\left(X_{11} - \frac{1}{\omega C_p} - \frac{X_{12}^2 \sin^2\delta}{\Delta X_2}\right) \quad (38)$$

$$V_{in} = \frac{\pi}{4} I_{inv} \|Z_{inv}\| \quad (39)$$

TABLE 1

SUMMARY OF SIMULATION RESULTS

|  | −40% R₂ | Optimal R₂ | +40% R₂ |
| --- | --- | --- | --- |
| $P_{in}$ (W) | 3662.15 | 3621.07 | 3638.49 |
| $V_{out}$ (V) | 132.90 | 171.57 | 203.00 |
| $R_2$ (Ω) | 4.34 | 7.23 | 10.12 |
| $I_1$ (A) | 22.59 | 28.33 | 33.09 |
| $I_2$ (A) | 39.00 | 30.21 | 25.53 |
| η (%) | 90.76 | 91.49 | 90.97 |
| δ (°) | 0.00 | 0.00 | 0.00 |
| Δ $P_{Loss}$ (W) | +41.09 W | 0.00 W | +17.42 |

Figure 5:
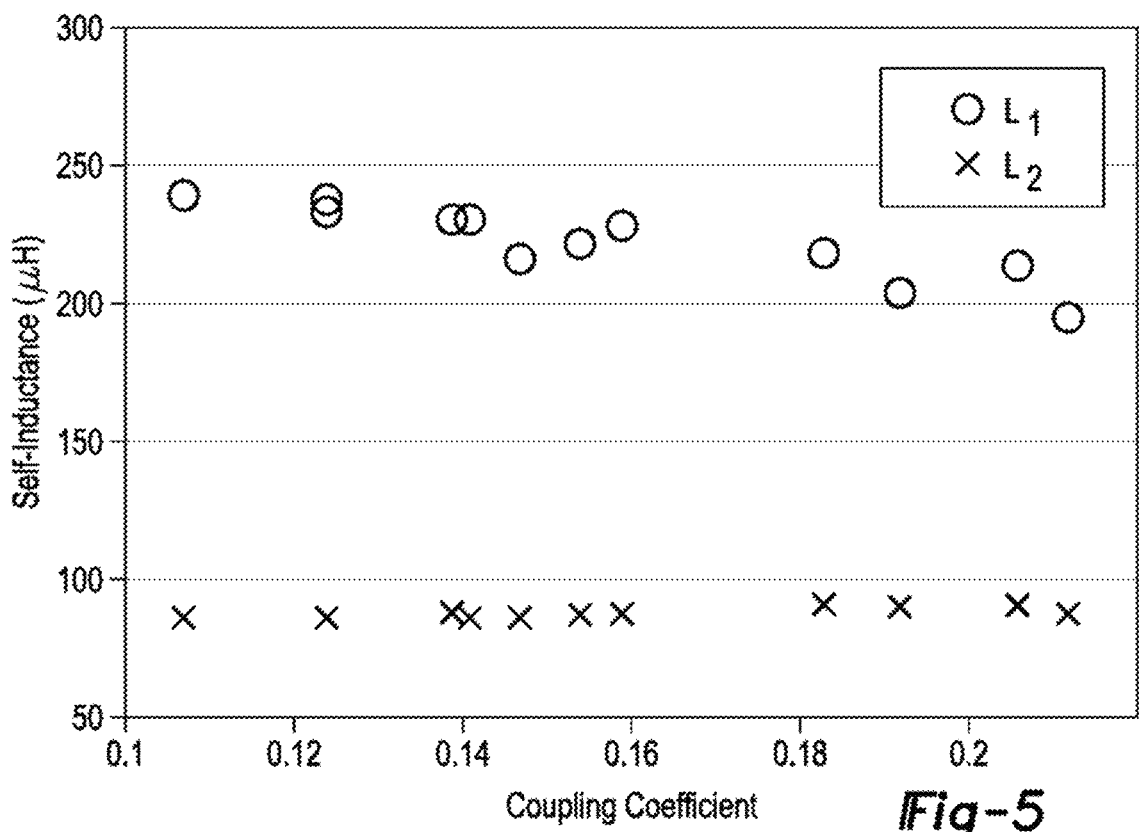
FIG. 5 is a plot of measured self-inductance of both transmitter and receiver couplers.

Perfect alignment between the vehicle-coil and ground-coil is not always guaranteed due to sensors tolerances. Hence, the system must be designed to tolerate a range of misalignment positions between the two coils. Alignment variations may cause frequency splitting, also known as bifurcation phenomena, which becomes noticeable as the coupling rate increases. This is expected because when two resonators are brought close to each other, their individual fields will start to interact with the resonators themselves. Thus, self-inductance of a WPT coupler may be altered due to the presence of another coupler next to it as shown in FIG. 5. As a result, each resonator or coupler will have a different resonant frequency; this is due to the perturbation in the coils' self-reactance which in turn causes reactance mismatch.

Figure 3A:
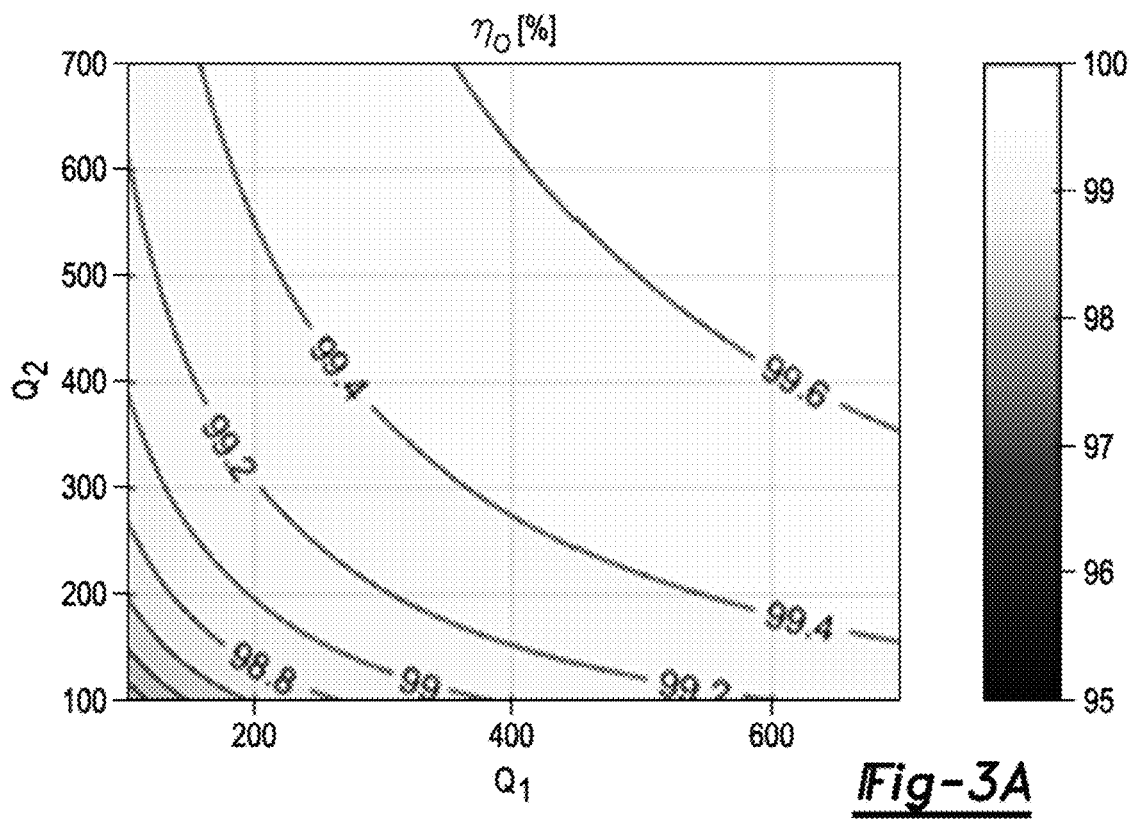
FIG. 3A is a plot of initial coupler efficiency under conditions of perfect matching and coupling.
Figure 3B:
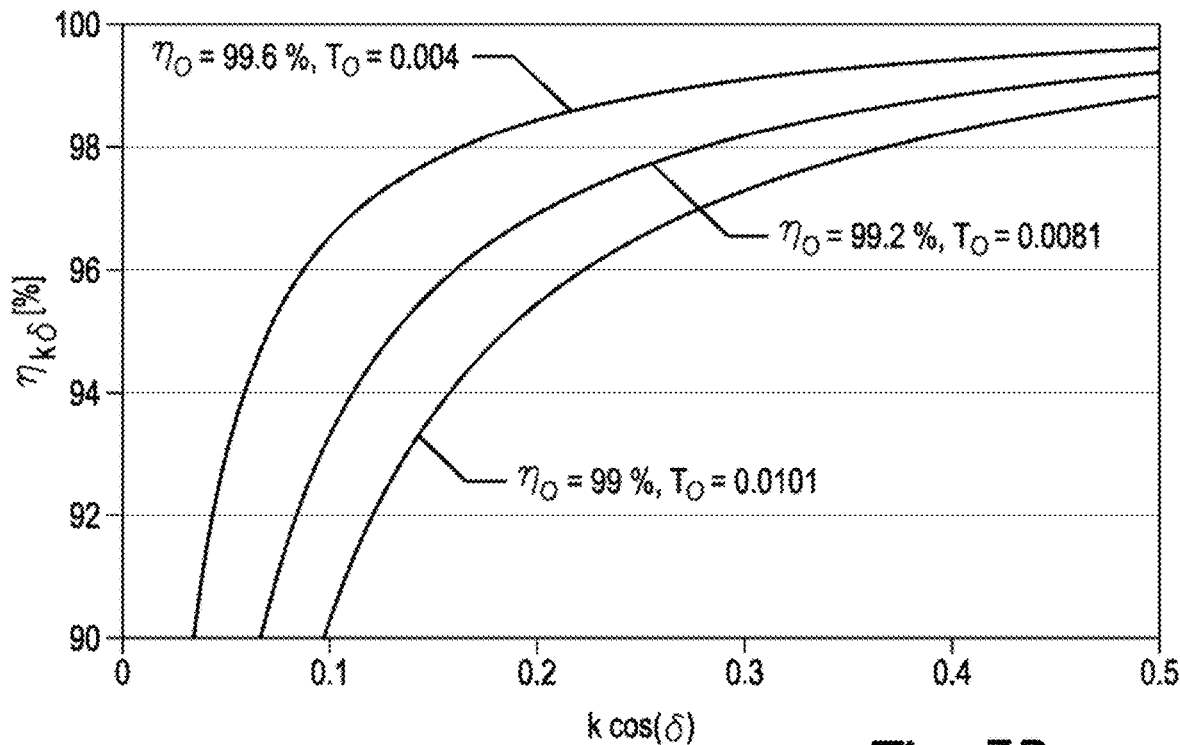
FIG. 3B is a plot of coupler efficiency while accounting for reactance mismatch and coupling coefficient.
Figure 4:
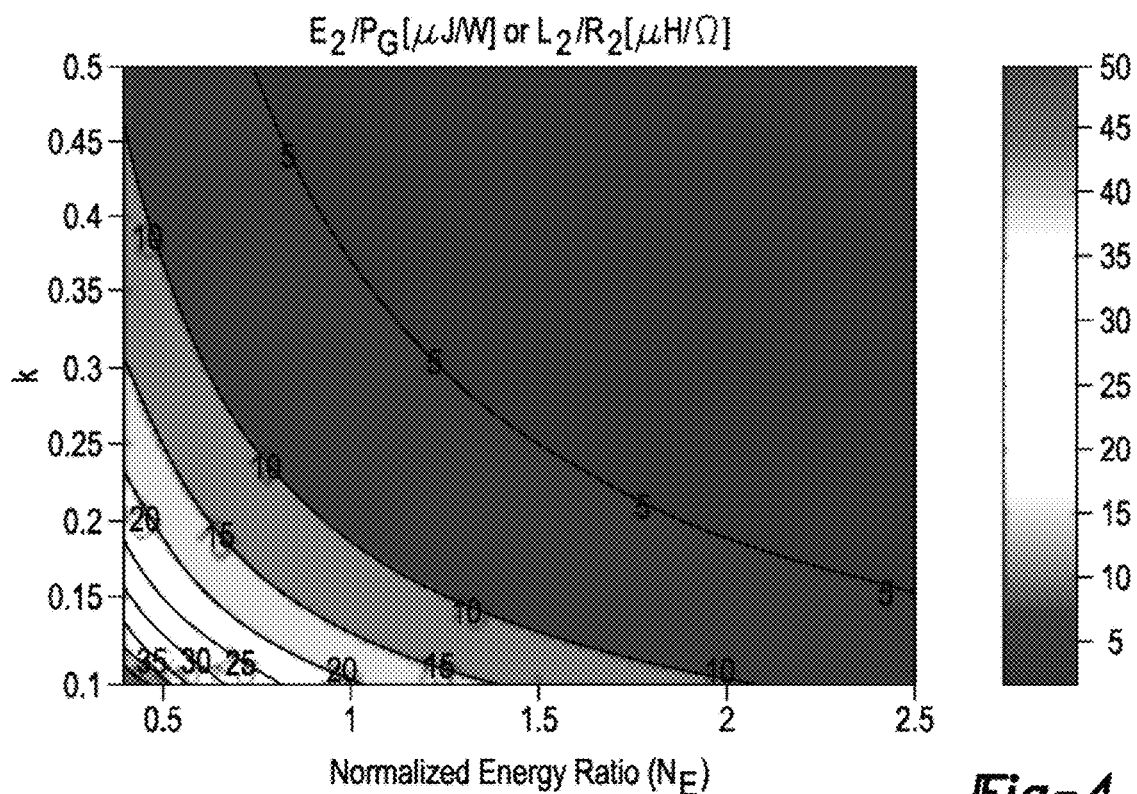
FIG. 4 is a plot showing the optimal ratio between energy stored in the magnetic field and transferred power at 85 kHz for the receiver coupler.

The initial efficiency, reflecting perfect magnetic coupling and impedance matching conditions is shown in FIG. 3A. Moreover, FIG. 3B shows their impact on efficiency. Thus, the absolute maximum coupler efficiency is calculated by taking the product of both efficiencies ($\eta=\eta_o\eta_{k\delta}$). This efficiency is achieved if and only if the energy per unit watt or inductance per unit ohm satisfy (40) for the transmitter and receiver coils, respectively. This ratio is used to guide the IMN design to achieve the efficiency calculated in FIG. 3A.

$$\frac{W_{m1(opt)}}{P_G} = \frac{L_p}{R_1} = \frac{N_E}{k\omega} \text{ and } \frac{W_{m2(opt)}}{P_G} = \frac{L_s}{R_2} = \frac{1}{k\omega N_E} \quad (40)$$

The impedance loading the secondary coupler impacts its efficiency. Constraints for both its real and imaginary components are needed to achieve the absolute maximum efficiency obtained in FIG. 3A. Any deviation from this optimal impedance will result in operation at lower efficiency. Perfect magnetic resonance is achieved when the reactive power in the secondary coupler is minimized (i.e. $\delta=\theta_1-\theta_2=0$). Hence, the reactance mismatch must be zero ($\Delta X2=0$). Additionally, the energy stored in the secondary coupler must satisfy (41). Accordingly, the optimal secondary coupler driving point impedance is calculated by (42).

$$W_{m2(opt)} = \frac{1}{2}L_2 I_2^2 \frac{P_G}{k\omega}\sqrt{\frac{Q_2}{Q_1}} \quad (41)$$

$$Z_{D2(opt)} k X_{22}\sqrt{\frac{Q_1}{Q_2}} - jX_{22} \quad (42)$$

From a circuit perspective, there are two factors that impact couplers' efficiency: Impedance mismatch and energy stored in the couplers' magnetic fields. By controlling both the real and imaginary components of the receive coil's driving point impedance, couplers' energies can be minimized according to their associated losses while achieving perfect matching condition. Hence, there is a need for a tunable impedance matching network (IMN).

Figure 8:
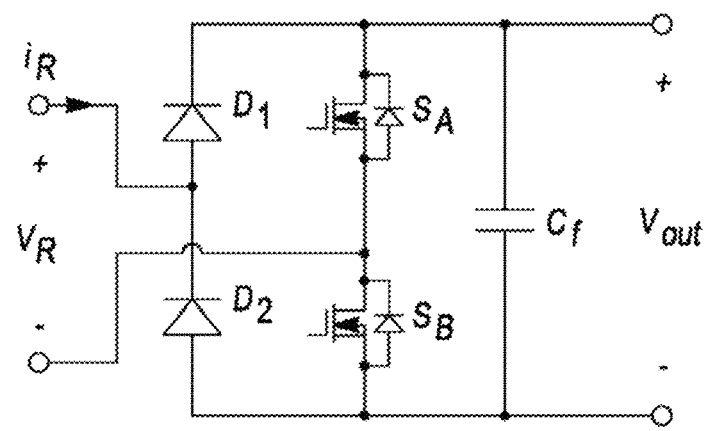
FIG. 8 is a schematic diagram of a rectifier.
Figures 9A, 9B, 9C, 9D, 9E:
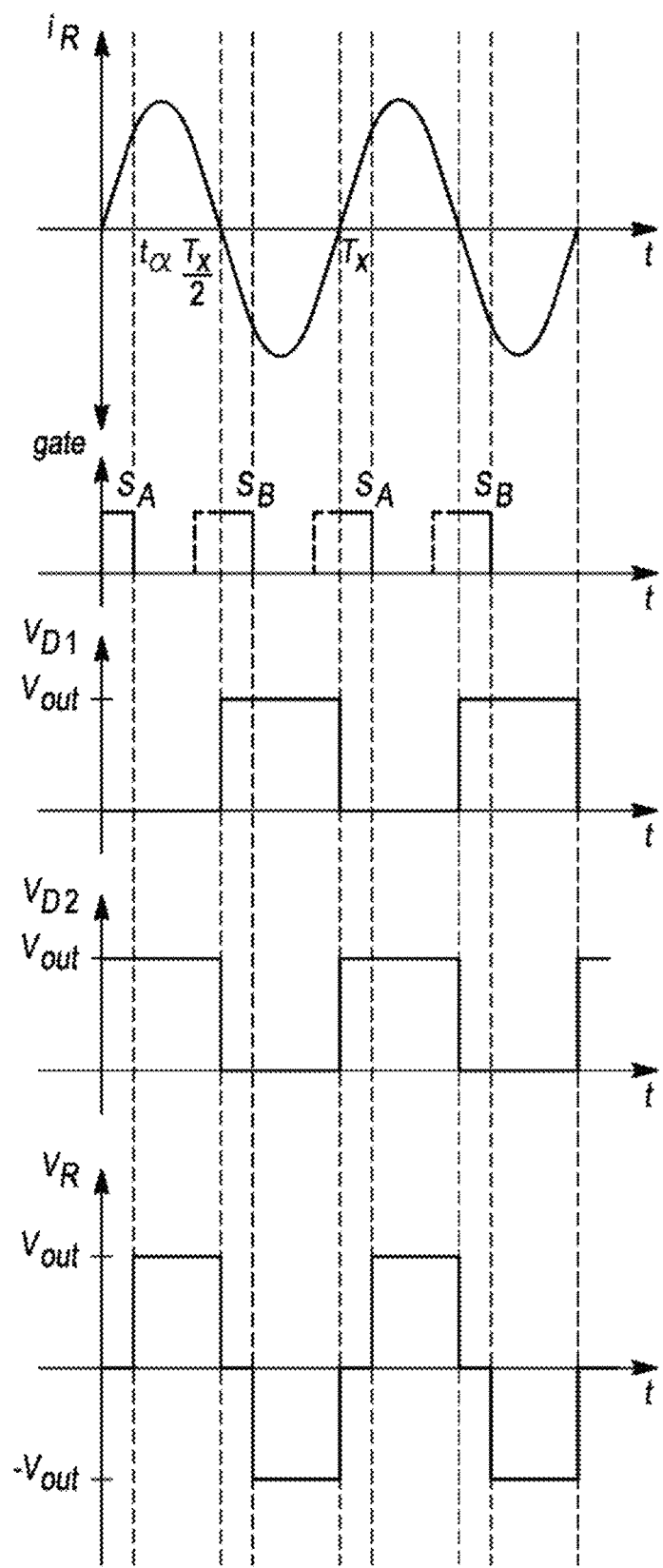
FIGS. 9A-9E are current and voltage wave forms associated with the rectifier of FIG. 8.

FIG. 8 is a schematic diagram of a rectifier including a pair of series diodes $D_1$, $D_2$, a pair of series switches $S_A$, $S_B$, and a capacitor $C_f$ in parallel with the series switches $S_A$, $S_B$. And, FIGS. 9A-9E show plots of input current $i_R$, gate status, diode voltage $V_{D1}$, diode voltage $V_{D2}$, and input voltage $V_R$ respectively versus time. By including the switches $S_A$, $S_B$ (e.g., MOSFETs) instead of diodes, switch commutation not only depends on the current polarity but also on switch on-time. If no gate signal is applied to the switches $S_A$, $S_B$ their body diodes along with the diodes $D_1$, $D_2$ form a full-bridge diode rectifier. Once the input current changes its polarity from negative to positive, $D_1$ and $S_B$'s body diode are forward biased. $S_B$ can be turned on at zero-volt any time before the input current changes polarity. A similar turn-on transition is realized for $S_A$ when its body diode and $D_2$ conduct due to the input current changing its polarity from positive to negative. The switches $S_A$, $S_B$, however, incur losses during their switching transition as they turn off. Typically, a MOSFET output capacitance is very small, thus drain-source voltage rises to its off-state prior to the channel current falling to zero.

Figure 10:
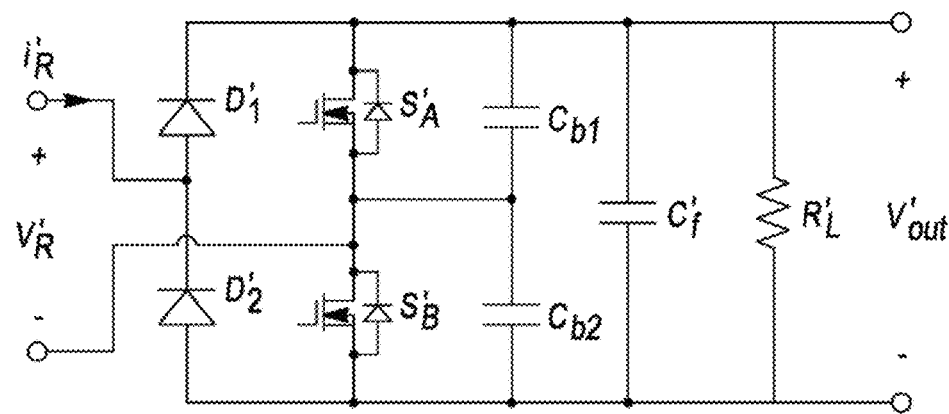
FIG. 10 is a schematic diagram of another rectifier.
Figure 11A:
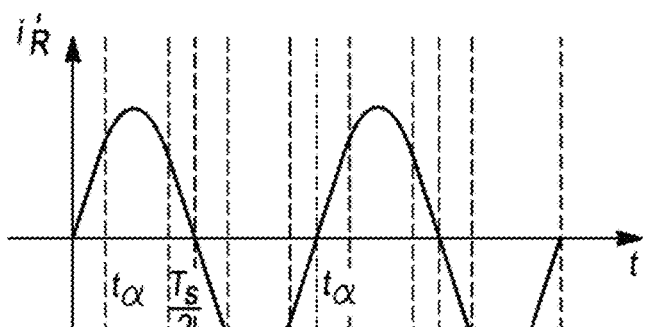
FIGS. 11A-11C are current and voltage wave forms associated with the rectifier of FIG. 10.
Figure 11B:
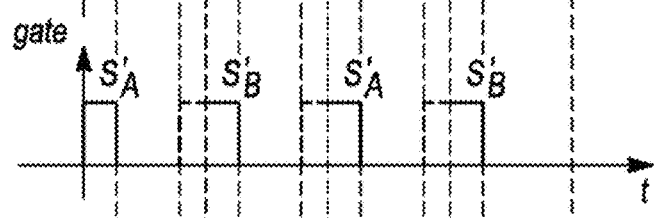
Figure 11C:
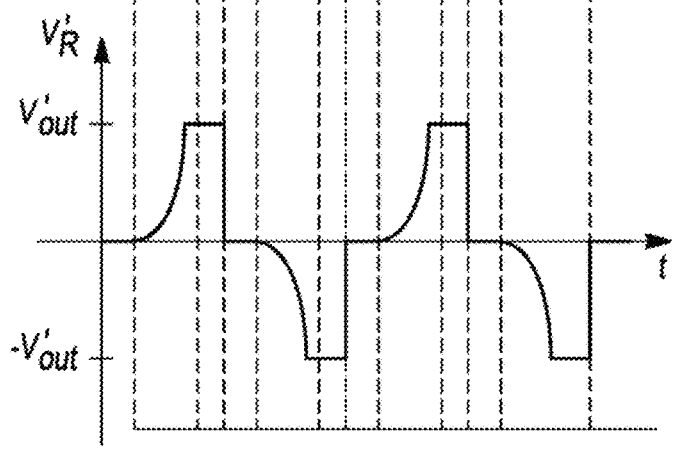

FIG. 10 is a schematic diagram of a rectifier for an inverter including a pair of series diodes $D_1'$, $D_2'$, a pair of series switches $S_A'$, $S_B'$, a pair of series capacitors $C_{b1}$, $C_{b2}$, a capacitor $C_f'$ in parallel with the series capacitors $C_{b1}$, $C_{b2}$, and a load $R_L$ (e.g., a traction battery) in parallel with the capacitor $C_f'$. FIGS. 11A-11C show plots of input current $i_R'$, complementary operation gate status, and input voltage $V_R'$ respectively versus time. Here, the capacitor $C_{b1}$ is in parallel with the switch $S_A'$ and the capacitor $C_{b2}$ is in parallel with the switch $S_B'$. By adding the capacitors $C_{b1}$, $C_{b2}$, power loss incurred during the transition of switches $S_A$, $S_B$ is reduced. The effective output capacitance of the switches $S_A'$, $S_B'$ forces the voltage charging them to have a parabolic shape (as opposed to straight-line), thus achieving soft-switching. Because the addition of the capacitors $C_{b1}$, $C_{b2}$ does not have an impact on the switching losses, their value can be increased to help further tune matching network impedance.

With specific reference to FIG. 11C, the alternating voltage waveform expresses parabolic shape as the signal value approaches each of the positive and negative maximum voltage values (indicated by $V_{out}$ and $-V_{out}$). Moreover, the signal value has a zero-dwell period that precedes each of the parabolic approaches to the maximum voltage values, which correspond to the magnitude of voltage output to the load $R_L$.

The arrangements suggested by FIGS. 10, and 11A-11C introduce additional control variables to further optimize the couplers' energies. In the case of a fault condition, the secondary coil current is minimized by detuning the secondary IMN via control of the switches $S_A'$, $S_B'$. The arrangements thus permit control of real and imaginary components of the input impedance of the rectifier. Thus, within WPT one may better tune matching network reactance and optimize energy transfer in the coils to maximize coupler efficiency. Higher current stress, however, may be experienced by certain components of the rectifier.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A power system comprising:
   a traction battery; and
   a rectifier including a pair of diodes, a pair of switches, and a pair of capacitors each in parallel with a different one of the switches such that alternating current input to the rectifier results in alternating voltage having parabolic approaches to maximum magnitude values being input to the rectifier, the maximum magnitude values corresponding to a magnitude of voltage output to the traction battery.

2. The power system of claim 1, wherein the alternating voltage further has a zero-dwell period that precedes each of the parabolic approaches.

3. The power system of claim 1, wherein an input power factor of the rectifier corresponds to on-time of the switches.

4. The power system of claim 1, wherein the capacitors are in series.

5. The power system of claim 1 further comprising an additional capacitor in parallel with the pair of capacitors.

6. The power system of claim 1, wherein the switches are field effect transistors.

7. Vehicle power system circuitry comprising:
   a rectifier including a pair of diodes, a pair of switches, and a pair of capacitors each in parallel with a different one of the switches such that alternating current input to the rectifier and complementary operation of the switches results in alternating voltage having zero-dwell periods immediately followed by parabolic approaches to maximum magnitude values being input to the rectifier.

8. The circuitry of claim 7, wherein an input power factor of the rectifier corresponds to on-time of the switches.

9. The circuitry of claim 7, wherein the maximum magnitude values correspond to a magnitude of voltage output to a traction battery.

10. The circuitry of claim 7, wherein the capacitors are in series.

11. The circuitry of claim 7 further comprising an additional capacitor in parallel with the pair of capacitors.

12. The circuitry of claim 7, wherein the switches are field effect transistors.

13. A vehicle power inverter comprising:
a rectifier including a pair of diodes, a pair of switches, a pair of capacitors each in parallel with a different one of the switches, and another capacitor in parallel with the pair of capacitors, the pair of switches being electrically between the pair of diodes and the pair of capacitors, and the pair of capacitors being electrically between the pair of switches and the another capacitor.

14. The inverter of claim 13, wherein the rectifier is configured such that alternating current input to the rectifier and complementary operation of the switches results in alternating voltage having parabolic approaches to maximum magnitude values being input to the rectifier.

15. The inverter of claim 14, wherein the maximum magnitude values correspond to a magnitude of voltage output to a traction battery.

16. The inverter of claim 14, wherein the alternating voltage further has zero-dwell periods that precede each of the parabolic approaches.

17. The inverter of claim 13, wherein the pair of capacitors are in series.

18. The inverter of claim 13, wherein the switches are field effect transistors.

* * * * *